Feb. 18, 1969 G. S. REIDER, JR., ET AL 3,428,934

ELECTRICAL CONNECTOR FOR PRINTED CIRCUIT BOARD

Filed Feb. 28, 1967

United States Patent Office 3,428,934

Patented Feb. 18, 1969

3,428,934

ELECTRICAL CONNECTOR FOR PRINTED CIRCUIT BOARD

George Sylvester Reider, Jr., Highspire, and Edward Lamonte Seitz, Jr., Mechanicsburg, Pa., assignors to AMP Incorporated, Harrisburg, Pa.

Filed Feb. 28, 1967, Ser. No. 619,392

U.S. Cl. 339—17 8 Claims

Int. Cl. H05k *1/00;* H01r *5/04*

ABSTRACT OF THE DISCLOSURE

An electrical terminal securable in a printed circuit board or the like by solder which has a configuration to prevent collection of solder on the connection area.

This invention relates to terminals of the pin type adapted to be inserted into openings in printed circuit boards and secured thereto by solder.

In circuit building techniques, it is often necessary to connected electrical components to be printed circuit boards so that they can be readily replaced when necessary. A common technique to connect the components to the printed circuit boards is by stamped pins soldered on the printed circuit board which mate with sockets in the electrical components. A principal drawback of these pins is that the solder wicks up onto the connection area through a longitudinal seam of the connection area thereby making it difficult to connect the sockets of the components to the pins or a deformation of the socket occurs during the mating operation.

It is an object of this invention to provide an electirical pin for insertion into a printed circuit board which is subsequently solder-dipped wherein the connector precludes the solder from being drawn into contact shank thereof by capillary action.

It is another object of this invention to provide an electrical pin terminal which may be soldered to a printed circuit board and which will permit insertable attachment with the component socket in such a manner that the component may be easily fitted onto the board or withdrawn therefrom. The terminal is provided with a connection area to provide maximum contact pressure on the socket regardless of the number of insertions.

A further object of the invention is the provision of an electrical pin which is easily and inexpensively made from flat sheet metal, which is sufficiently rugged to withstand careless use, and which has a long and useful life.

Other objects and attainments of the present invention will become apparent to those skilled in the art upon a reading of the following detailed description when taken in conjunction with the drawings in which there is shown and described an illustrative embodiment of the invention; it is to be understood, however, that this embodiment is not intended to be exhaustive nor limiting of the invention but is given for purposes of illustration in order that others skilled in the art may fully understand the invention and the principles thereof and the manner of applying it in practical use so that they may modify it in various forms, each as may be best suited to the conditions of a particular use.

These and other objects of the invention are achieved in a preferred embodiment of an electrical terminal comprising a generally tubular stamped and formed member having a base on one end thereof defining a ferrule forming portion adapted to be inserted into a suitable hole in a printed circuit board and secured thereto by solder. The member has a contact shank on the other end thereof for engagement with a socket on an electrical component. An annular bead, for positioning the terminal in a board, is formed between the base and the contact shank. A suitable aperture in the bead defines an obstruction to impede solder flow and prevent it from entering the contact shank and subsequently bleeding from the seam thereof and onto the contact portion.

Figures 1, 2, 3, 4:
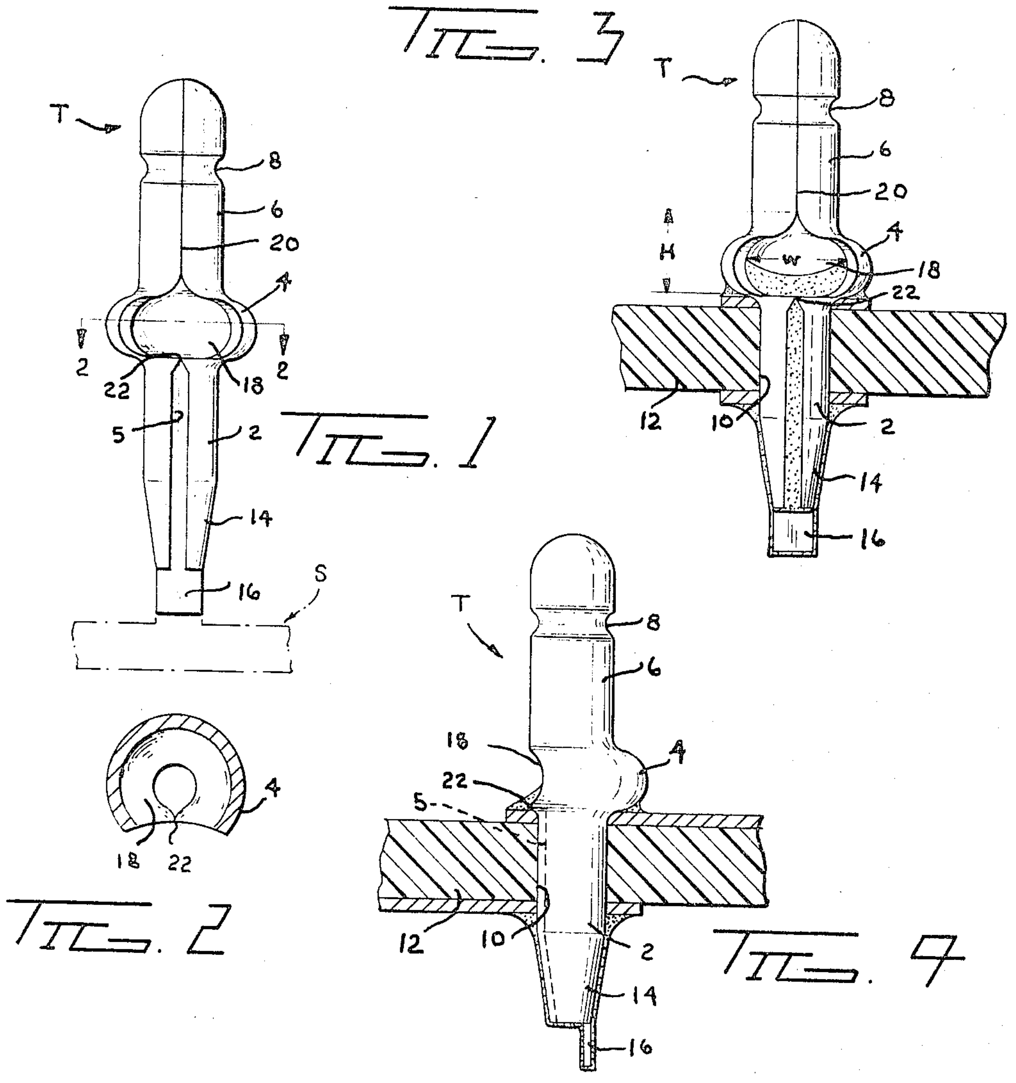
FIGURE 1 is a front plan view of a terminal in accordance with this invention.
FIGURE 2 is a cross-sectional view taken through lines 2—2 of FIGURE 1.
FIGURE 3 is an elevational view showing the terminal of FIGURE 1 secured to a printed circuit board.
FIGURE 4 is a side view of FIGURE 3.

Referring now to the drawings, and particularly to FIGURES 1 and 2, a terminal T employing the principles of this invention may be made of any suitable material, e.g., brass, etc. The terminal is preferably stamped out of sheet metal in accordance with conventional progressive stamping techniques to form a base 2, an annular bead 4 and a contact shank 6. An annular indent 8, for engaging an associate bead or ridge on the socket of a component (not shown), is formed around the periphery of shank 6.

The base 2 is comprised of a ferrule-forming portion which is made to a diameter to provide an interference fit with a hole 10 in a printed circuit board 12. This arrangement allows a terminal to be held in a board by friction prior to solder-dipping the board because base 2 is longitudinally split to define open space 5 between opposing edges of the base so that the base has spring characteristics. Base 2 terminates in a tapered section 14 constituting lead-in means to guide the terminal into hole 10. A tab 16 may extend beyond section 14. Tab 16 is the remains of a bridging strip which secures terminal T to a parent strip S or to another terminal during forming so that large numbers of terminals may be easily stored and handled prior to their use. Each terminal is ultimately severed from strip S prior to being used.

Directly adjacent and continuous with base 2 and shank 6 is bead 4 which is made to a larger diameter than base 2 and shank 6 thereby constituting a positioning means to prevent shank 6 from entering hole 10 in the printed circuit board. Shank 6 defines a contact area and has a larger diameter than base 2 but the obverse may be necessary or the shank and the base may have the same diameter to accommodate an intended result. Bead 4 is of substantial dimension to allow a large aperture 18 to be formed therein. Aperture 18 defines an obstruction which stops the capillary action of liquid solder and prevents it from entering shank 6 and bleeding from the seam 20 thereof. Aperture 18 is in communication with seam 20.

Figure 5:
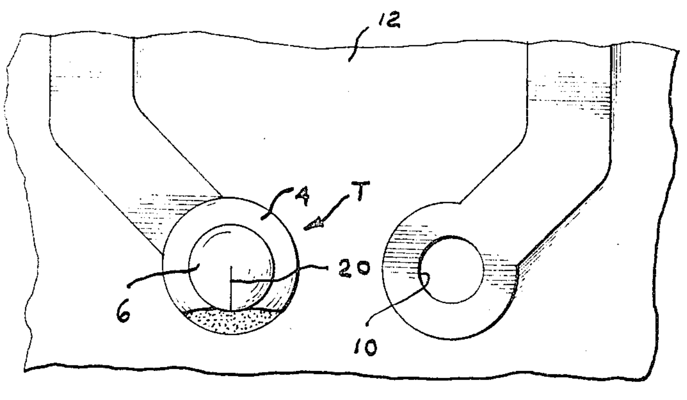
FIGURE 5 is a partial top plan view of FIGURES 3 and 4.

The height H of aperture 18 is substantially the same as the diameter of shank 6 or base 2, whereas the width W of aperture 18 is greater than the diameter of the shanks or base. This provides a sufficiently large opening which reduces or breaks the surface tension of the solder and thereby stops capillary action of liquid solder. The size of the aperture, which is relatively larger than the general diameter of the terminal does not affect the columnar strength of shank 6 by virtue of the size of bead 4 which is not, however, any larger than the annular connected area of the conductive path on the printed circuit board to which the terminal is to be connected, FIGURE 5.

Directly above and continuous with bead 4 is the contact shank 6 which ultimately projects above board 12 and which receives a component socket. Seam 20 is closed along shank 6 by virtue of abutting edges, but is not soldered, welded, or otherwise mechanically sealed which facilitates the manufacture thereof. Seam 20 continues around aperture 18 to the bottom thereof where it joins base 2. Seam 20 closes at juncture 22, and reopens along base 2 to form space 5, FIGURE 1. Space 5 allows liquid solder to flow outwardly against board 12 where the solder will fill any voids between base 2 and hole 10.

It is to be noted that unless solder is prevented from wicking up shank 6, it would bleed from seam 20, thus preventing proper engagement of an associated socket or deformation of the socket when the socket is forced onto the shank. Aperture 18 also causes the liquid solder to flow outwardly onto board 12, FIGURES 3 and 4, where it causes no detrimental effect to a mating socket.

Changes in construction will occur to those skilled in the art and various apparently different modifications and embodiments may be made without departing from the scope of the invention. The matter set forth in the foregoing description and accompanying drawings is offered by way of illustration only.

What is claimed is:

1. An electrical terminal adapted to be secured in an opening in a printed circuit board comprising base means adapted to be secured into said opening by solder positioning means including an annular bead formed adjacent said base means, shank means disposed to project beyond said bead and made with an associated socket, said bead having an aperture to prevent the solder from traveling from said base means to said shank means, said aperture having a width larger than the diameter of said base means or said shank means.

2. An electrical terminal adapted to be secured in an opening in a printed circuit board comprising base means including a ferrule-forming portion adapted to be secured into said opening by solder, positioning means including an annular bead formed adjacent said base means to limit insertion travel of said base means into said board, shank means disposed to project beyond said bead and mate with an associate socket, said bead having an opening therein to prevent the solder from traveling from said base means to said shank means, said opening having a width substantially greater than the diameter of said base means or said shank means and having a height substantially the same as the diameter of said base means or shank means.

3. An electrical terminal adapted to be secured in an opening in a printed circuit board comprising base means including a ferrule-forming portion adapted to be secured into said opening by solder, positioning means including an annular bead formed adjacent said base means to limit insertion travel of said base means into said board, shank means disposed to project beyond said bead and said board and mate with an associate socket, said bead having an aperture to break surface tension of the solder and prevent the solder from traveling from said base means to said shank means, said aperture having a width substantially greater than the diameter of said base means or said shank means and having a height substantially the same as the diameter of said base means or shank means, and a longitudinal seam extending from said shank means through said bead to said base means.

4. A terminal according to claim 3 wherein edges of said seam part at the top of said bead, and join at the bottom thereof to form said aperture.

5. A socket-receiving terminal member adapted to be secured in an opening in a printed circuit board comprising a contact shank with a longitudinal seam and a base, an annular bead disposed between said shank and base, said bead being larger in diameter than said shank or base, means on said shank including an annular indent to receive a circumferential ridge of a socket member, means on said base including a space to allow solder to flow outwardly to said opening in said printed circuit board, said bead including an opening larger than the diameter of said base or shank and communicating with said seam to break surface tension of liquid solder and thereby prevent said solder from wicking into said shank and bleeding from the seam thereof.

6. An electrical terminal for insertion in an opening of a board member and being solderable to a conductive area on said board member, said electrical terminal comprising a base section for disposition in said opening, a bead section adjacent said base section for engagement with said conductive area and for limiting movement of said base section into said opening, a connection section extending outwardly from said bead section for electrical engagement with a complementary electrical connector, said bead section having a diameter larger than either of said base section and said connection section, said bead section having an opening larger than the diameter of either of said base section and said connection section to prevent solder from wicking onto said connection section upon said electrical terminal being soldered to said conductive area.

7. An electrical terminal according to claim 6 wherein said base section includes longitudinal edges spaced from each other so that said base section springably engages said opening.

8. An electrical terminal according to claim 6 wherein said opening has a height substantially the same as the diameter of either of said base section and connection section and a width larger than the diameter of either of said base section and connection section.

References Cited

UNITED STATES PATENTS

| | | | |
|---|---|---|---|
| 2,877,441 | 3/1959 | Narozny | 339—17 X |
| 3,317,888 | 5/1967 | Mancini | 339—275 X |

FOREIGN PATENTS

| | | |
|---|---|---|
| 135,739 | 10/1964 | Australia. |

MARVIN A. CHAMPION, *Primary Examiner.*

P. A. CLIFFORD, *Assistant Examiner.*

U.S. Cl. X.R.

339—275